(12) United States Patent
Heusler et al.

(10) Patent No.: US 12,324,133 B2
(45) Date of Patent: Jun. 3, 2025

(54) COOLED PULSE INVERTER FOR OPERATING AN ELECTRIC MACHINE OF A MOTOR VEHICLE

(71) Applicant: Dr. Ing. h.c. F. Porsche Aktiengesellschaft, Stuttgart (DE)

(72) Inventors: Pascal Heusler, Stuttgart (DE); Patrick Fuchs, Leonberg (DE); Karl Dums, Renningen (DE); Maximilian Barkow, Stuttgart (DE); Timijan Velic, Weissach (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 344 days.

(21) Appl. No.: 17/882,662

(22) Filed: Aug. 8, 2022

(65) Prior Publication Data

US 2023/0057989 A1    Feb. 23, 2023

(30) Foreign Application Priority Data

Aug. 18, 2021 (DE) ................. 10 2021 121 444.0

(51) Int. Cl.
| | |
|---|---|
| *H02K 9/19* | (2006.01) |
| *H02K 5/02* | (2006.01) |
| *H02K 9/197* | (2006.01) |
| *H02K 11/33* | (2016.01) |
| *H02M 7/00* | (2006.01) |
| *H05K 7/20* | (2006.01) |

(52) U.S. Cl.
CPC .......... *H05K 7/20927* (2013.01); *H02K 5/02* (2013.01); *H02K 9/19* (2013.01); *H02K 9/197* (2013.01); *H02K 11/33* (2016.01); *H02M 7/003* (2013.01)

(58) Field of Classification Search
None
See application file for complete search history.

(56) References Cited

U.S. PATENT DOCUMENTS

| | | | | |
|---|---|---|---|---|
| 2008/0049476 | A1* | 2/2008 | Azuma | ................. B60L 50/61 361/699 |
| 2010/0026090 | A1* | 2/2010 | Nakatsu | ................. B60L 50/16 307/9.1 |

(Continued)

FOREIGN PATENT DOCUMENTS

| | | |
|---|---|---|
| DE | 19545448 A1 | 6/1997 |
| DE | 102017204112 A1 | 9/2018 |

(Continued)

*Primary Examiner* — Courtney L Smith
(74) *Attorney, Agent, or Firm* — LEYDIG, VOIT & MAYER, LTD.

(57) ABSTRACT

A pulse inverter for operating an electric machine of a motor vehicle from a motor vehicle battery, including a housing for delimiting an interior, a power electronics system, provided in the interior of the housing, for converting direct current to alternating current, a first cooling circuit configured to dissipate heat from an outer side of the housing facing away from the power electronics system, and a second cooling circuit, which is separated from the first cooling circuit and communicates with the interior of the housing, configured to directly liquid-cool the power electronics system with an electrically insulating fluid. (FIG. 1)

15 Claims, 2 Drawing Sheets

(56) References Cited

U.S. PATENT DOCUMENTS

| | | | |
|---|---|---|---|
| 2015/0003019 A1* | 1/2015 | Ide | H05K 7/02 |
| | | | 361/728 |
| 2022/0072972 A1* | 3/2022 | Yu | B60L 53/60 |
| 2022/0126701 A1* | 4/2022 | Gagas | B60L 53/24 |
| 2023/0029680 A1* | 2/2023 | Schulz | H02M 1/325 |

FOREIGN PATENT DOCUMENTS

| | | |
|---|---|---|
| DE | 102020105925 A1 * | 9/2021 |
| EP | 2555606 A1 | 2/2013 |
| WO | WO 9507323 A1 | 3/1995 |

* cited by examiner

COOLED PULSE INVERTER FOR OPERATING AN ELECTRIC MACHINE OF A MOTOR VEHICLE

This application claims benefit to German Patent Application No. DE 10 2021 121 444.0, filed on Aug. 18, 2021, which is hereby incorporated by reference herein.

FIELD

The invention relates to a cooled pulse inverter using which an electric machine of a motor vehicle can be operated with alternating current from a DC motor vehicle battery.

BACKGROUND

EP 2 555 606 A1 discloses providing cooling ducts in a wall of a housing for a converter module in order to re-cool dielectric fluid, which is enclosed in an interior of the housing, for absorption of heat arising in converter components.

DE 10 2017 204 112 A1 discloses cooling a pulse inverter for an electric motor of an electric vehicle using a cooling circuit which is fed through the housing of a pulse inverter and directly cools electronic semiconductor components using an electrically insulating coolant.

There is a constant need to improve the cooling of a pulse inverter.

SUMMARY

In an embodiment, the present disclosure provides a pulse inverter for operating an electric machine of a motor vehicle from a motor vehicle battery, comprising a housing for delimiting an interior, a power electronics system, provided in the interior of the housing, for converting direct current to alternating current, a first cooling circuit configured to dissipate heat from an outer side of the housing facing away from the power electronics system, and a second cooling circuit, which is separated from the first cooling circuit and communicates with the interior of the housing, configured to directly liquid-cool the power electronics system with an electrically insulating fluid.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
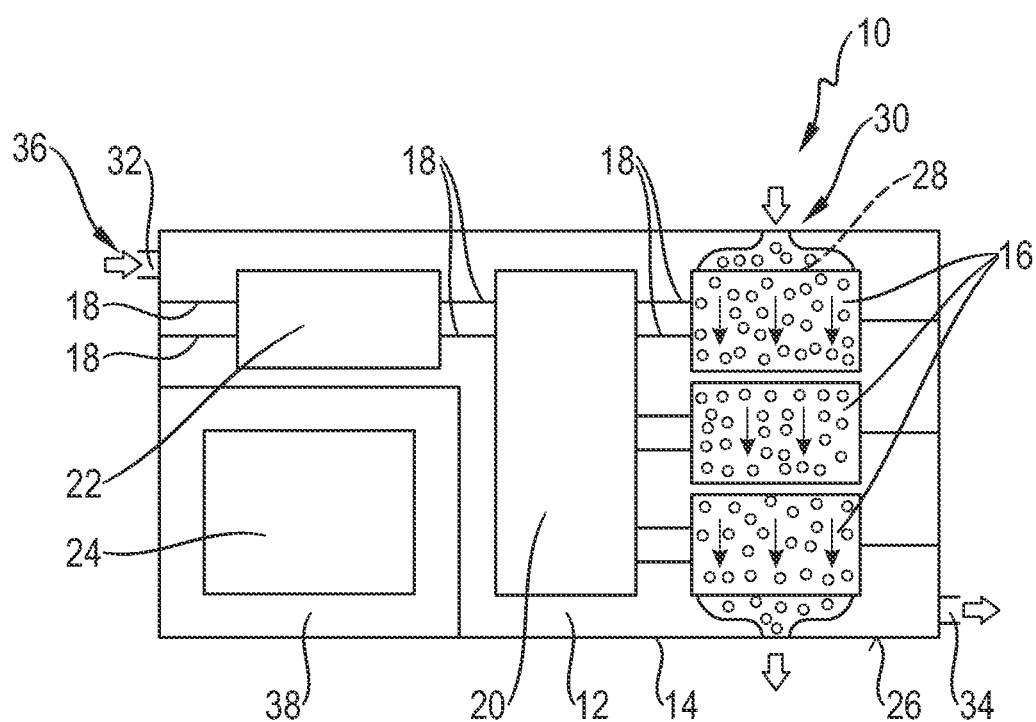
FIG. 1 shows a schematic partially sectioned plan view of a pulse inverter.

Embodiments of the present invention specify measures which make it possible to cool a pulse inverter well.

Preferred refinements of the invention are specified in the following description, which may in each case individually or in combination represent an aspect of the invention. When a feature is shown in combination with another feature, this is used only for simplified illustration of the invention and should in no way mean that this feature cannot be a development of the invention without the other feature.

An embodiment relates to a pulse inverter for operating an electric machine of a motor vehicle from a motor vehicle battery, comprising a housing for delimiting an interior, a power electronics system, provided in the interior of the housing, for converting direct current to alternating current, a first cooling circuit for dissipating heat from an outer side of the housing facing away from the power electronics system and a second cooling circuit, which is separated from the first cooling circuit and communicates with the interior of the housing, for directly liquid-cooling the power electronics system by way of an electrically insulating fluid.

Instead of providing just one cooling circuit for cooling the pulse inverter, two different cooling circuits independent of one another and separated from one another are provided. The first cooling circuit cools on the outer side of the housing while the second cooling circuit flows through the housing and cools within the housing. The respective cooling circuit can dissipate the absorbed heat at a distance from the components of the pulse inverter which are to be cooled, for example by way of an evaporator and/or a heat exchanger, for example a front-end cooler of the motor vehicle, and feed same to the pulse inverter at a correspondingly low temperature. The first cooling circuit can absorb heat that the second cooling circuit was unable to absorb. In addition, the first cooling circuit can absorb heat from the fluid of the second cooling circuit. As a result, a temperature increase of the fluid of the second cooling circuit can be kept low so that a high temperature gradient between the components which are to be cooled, in particular the power electronics system and the fluid of the second cooling circuit, can be maintained. The cooling power of the second cooling circuit can be improved as a result. Despite cooling using the second cooling circuit, heat reaching the outer side of the housing can be absorbed and dissipated by the first cooling circuit. In this case, use is made of the knowledge that, during performant electrical operation of an electrically drivable motor vehicle, cooling of the power electronics system by the limited heat capacity of an electrically insulating fluid of the second cooling circuit may be insufficient. Since an electrically conductive fluid, in particular a water/glycol mixture, can also be used for the second cooling circuit, a high amount of heat can be absorbed by the fluid of the first cooling circuit in the case of a small temperature increase. In addition, the fluid of the second cooling circuit can convey heat rapidly from heat-emitting components to the housing by way of turbulent flows, where the fluid of the first cooling circuit can dissipate the heat. As a result, the cooling power may be higher than the sum of the respective individual cooling powers of the first cooling circuit and the second cooling circuit without the respective other cooling circuit. Good cooling of the pulse inverter is achieved by cooling within the housing using an electrically insulating fluid with a low heat capacity and cooling on the outer side of the housing using a non-insulating fluid with a high heat capacity.

The housing of the pulse inverter can have an inlet and an outlet for the fluid of the second cooling circuit. The inlet and outlet are provided in particular as far away as possible from one another in a wall of the housing so that the fluid of the second cooling circuit flows through the housing along a correspondingly long flow path and can absorb a correspondingly large amount of heat. The inlet and/or the outlet has/have in particular fastening technology, in particular a pipe connection, using which a supply line of the second cooling circuit can be connected. The first cooling circuit and/or the second cooling circuit is/are embodied in particular so as to be closed, with the result that the same fluid of the respective cooling circuit can be conveyed in the circuit. In principle, it is possible that the at least one cooling duct of the first cooling circuit is provided in a wall of the housing. The housing is preferably configured so as to be separate from the first cooling circuit so that at least one cooling duct of the first cooling circuit is placed on the outer side of the housing. In particular, the outer side of the housing delimits a portion of the cooling duct of the first cooling circuit so that a correspondingly low heat conduction resistance is formed between the housing and the fluid of the first cooling circuit. A complicated integration of the first cooling circuit into the geometry of the housing of the pulse inverter is thereby avoided.

A suitable liquid fluid for the second cooling circuit is described for example in WO 95/07323 A1, to the contents of which reference is hereby made as part of the invention. The significantly optimized thermal connection and/or dissipation of heat achieved using the electrically insulating cooling fluid, in particular acting as dielectric, can also improve the power density and the continuous power stability of the pulse inverter. The pulse inverter configured in this way is thereby suitable in particular for high-performance applications, for example for sports cars or racing vehicles. Good cooling power without the risk of a short circuit can be achieved by the direct cooling of the power electronics system and/or further components such that a pulse inverter with a high service life, a high power density and a high continuous power stability is made possible even in high-performance applications for sports vehicles.

The pulse inverter is configured to convert a DC voltage provided by the motor vehicle battery to a multiphase AC voltage for operating the electric machine and thereby to control the electric machine. The motor vehicle can be driven electrically using the electric machine fed from the vehicle battery via the pulse inverter. If the motor vehicle is intended to be driven electrically in a particular operating situation, the pulse inverter receives a corresponding signal in order to electrically provide a particular demanded torque. To this end, the pulse inverter can set corresponding voltages in the power electronics system thereof, said voltages resulting in corresponding electric currents leading to the electric machine. The power electronics system can comprise semiconductor switches, which are configured in particular as MOSFETs and the gate of which is driven by a controller, in particular via pulse-width modulation or space vector modulation, in order to produce the desired AC voltage. Voltage and current ripples can be smoothed by way of a link capacitor, which is connected in parallel with the power electronics system via the contact rails, by virtue of the link capacitor being charged and discharged again accordingly.

In particular, a link capacitor, coupled to the power electronics system, for smoothing voltage ripples and/or current ripples and/or a driver for switching electric components of the power electronics system and/or of the link capacitor and/or a controller for controlling the power electronics system in response to an actuating signal is arranged in the interior of the housing, wherein, in particular, the link capacitor and/or the driver and/or the controller has the fluid of the second cooling circuit flowing around it. As a result, components of the pulse inverter which may have a lower development of heat than the power electronics system can also be cooled by the fluid of the second cooling circuit such that the cooling power for the pulse inverter and thus the efficiency of the pulse inverter can be further improved.

The power electronics system can have in particular a commutation cell which can have a plurality of semiconductor switches. In particular, a link capacitor can be integrated in the power electronics system, for example can share a common printed circuit board with the rest of the power electronics system, with the link capacitor alternatively being able to be provided as a separate modular unit which is interconnected with the rest of the power electronics system. The semiconductor switches used in the power electronics system can be based in particular on silicon (IGBTs) and/or silicon carbide (MOSFETs). Sensors for detecting voltages and/or electric currents are preferably integrated in the power electronics system.

The driver, which is also referred to as gate driver, can actuate the semiconductor switches of the power electronics system. The driver is connected to the power electronics system in particular in a low-inductance manner and to this end is preferably positioned particularly close to the power electronics system. The driver can be integrated in the power electronics system, for example can share a common printed circuit board with the rest of the power electronics system, with the driver alternatively being able to be provided as a separate modular unit which is interconnected with the rest of the power electronics system.

The controller can provide the control of the electric machine actuated by means of the power electronics system. The controller can calculate in particular the AC voltage to be set and, using the driver, can actuate the semiconductor switches of the power electronics system by means of a suitable modulation method, in particular pulse-width modulation or space vector modulation. In this case, measurement values of sensors in the power electronics system can preferably be transmitted to the controller in order to improve control of the power electronics system.

The controller is preferably provided in a dry space separated from the fluid of the second cooling circuit, wherein electrical lines and/or signal lines connected to the controller are guided through a partition in the dry space into the interior which communicates with the second cooling circuit. Depending on the configuration of the controller and the connection technology thereof, it may be advantageous not to provide the controller in the part of the interior through which the fluid of the second cooling circuit flows, which part is sealed in a fluid-tight manner. Leakage of the fluid via the connection technology of the controller can thus be prevented. In this case, use is made of the knowledge that the development of heat of the controller generally does not limit performance and, for reasons of cost, a fluid cooling system can be saved due to the fluid of the second cooling circuit if this enables a more cost-effective connection technology of the controller. Unnecessary cost increases can be avoided as a result.

Electronic components and/or electrical lines and/or signal lines provided in the interior of the housing particularly preferably have electrically conductive elements, wherein at least a portion of the electrically conductive elements are in direct contact with the fluid and/or at least a portion of the electrically conductive elements are covered by an anticorrosive material, in particular a lacquer and/or a potting compound. Depending on the configuration of the electrical components, in particular the semiconductor switches, direct contact can be permitted between the electrically conductive material where the heat arises and the electrically nonconductive fluid of the second cooling circuit in order to achieve the lowest possible heat conduction resistance. If impairment of the electrically conductive material, for example due to corrosion effects, is feared, a protective layer, in particular in the form of a lacquer or a potting compound, can be provided between the electrically conductive material and the fluid, with the result that a low heat conduction resistance but a sufficiently high service life is still always ensured.

In particular, the first cooling circuit and the second cooling circuit cool the power electronics system in a cross-flow configuration. The average flow direction of the first cooling circuit and the average flow direction of the second cooling circuit can be oriented substantially at a right angle in the region of the pulse inverter. The flow directions of the first cooling circuit and the second cooling circuit are preferably oriented substantially horizontal, with in particular the flow directions of the first cooling circuit and the second cooling circuit being able to be provided offset to one another in the vertical direction. For example, the first cooling circuit can cool an outer side on the underside of the housing, with in particular the outer side of the underside delimiting a portion of a cooling duct of the first cooling circuit.

The first cooling circuit preferably has a flow cross-section corresponding to the extent of the power electronics system, wherein the extent of the interior and of the housing is greater than the extent of the power electronics system. As a result, the first cooling circuit essentially cools only in that subregion of the housing where the power electronics system is provided. In this case, it is possible to take into account the fact that sufficient cooling of the other components of the pulse inverter, which generally do not become as warm as the power electronics system, is already achieved by way of the second cooling circuit, such that cooling over an unnecessarily large area by way of the first cooling circuit is avoided. The first cooling circuit can be dimensioned to be smaller as a result, for example with a pump of smaller dimensions, such that the provision of two cooling circuits, separate from one another, for cooling the pulse inverter leads only to a surprisingly low increase in the energy demand.

The second cooling circuit is particularly preferably designed to produce a turbulent flow at least in the region of the power electronics system. The turbulent flow of the fluid of the second cooling circuit can improve the heat transport from the power electronics system to the housing and as a result can be dissipated more quickly to the fluid of the first cooling circuit. To this end, the second cooling circuit can have a correspondingly high flow rate and/or suitable guide elements for deflecting and/or swirling the flow of the fluid of the second cooling circuit are provided in the interior of the housing.

In particular, the power electronics system and/or further components is/are supported via webs in particular on the housing, which project, in particular from a printed circuit board, wherein the second cooling circuit is set up to convey the fluid between the webs. Using the projecting webs, it is possible to form between a housing of the respective component and a printed circuit board of the respective component a spacing from an adjacent part of the pulse inverter, in particular the housing and/or a conductor rail and/or another component, The fluid of the second cooling circuit can flow through this intermediate space in order to flow around and be able to cool the respective component, in particular the power electronics system. The webs are preferably optimized in terms of flow technology. For example, the webs have a round, elliptical, wedge-shaped and/or droplet-shaped cross section for providing a low flow resistance.

The power electronics system preferably has cooling structures which project into a flow cross section of the first cooling circuit. The cooling structures of the power electronics system, which are configured for example as cooling ribs, can project through the housing of the pulse inverter into a cooling duct of the first cooling circuit. The cooling power can thus be further improved.

The housing is particularly preferably produced from a metallic material. As a result, the housing can have a lower heat conduction resistance in comparison with a plastic material, as a result of which the heat dissipation to the fluid of the first cooling circuit is further improved.

The pulse inverter 10 illustrated in FIG. 1 can be used to operate an electric machine of an electrically drivable motor vehicle, in particular in order to appropriately drive the electric machine for the purely electrical drive of the motor vehicle in response to a driver demand and to feed said electric machine from a motor vehicle battery, in particular a rechargeable traction battery. The pulse inverter 10 can to this end have a power electronics system 16 provided in an interior 12 of a metallic housing 14, the power electronics system being able to be composed in particular of several parts. The power electronics system 16 can be electrically connected to a link capacitor 20 and a driver 22 via electrical lines 18. The driver 22 can be actuated by a controller 24, which can be connected in particular to sensors in the power electronics system 16, said sensors measuring voltages and/or current intensities, for example. The controller 24 can detect a driver demand and to this end actuate the driver 22 taking into account the voltages and/or current intensities measured in the power electronics system 16, with the result that the driver 22 can suitably switch semiconductor switches in the power electronics system 16 and/or in the link capacitor 20.

The housing 14, in particular an underside of the housing 14, can be cooled using a cooling duct 28 of a first cooling circuit 30 provided on an outer side 26 of the housing 14. In particular, the cooling duct 28 of the first cooling circuit 30 is provided only in the surface region of the housing 14 in which the power electronics system 16 is also provided. In addition, the housing has an inlet 32 and an outlet 34 such that an electrically insulating and dielectric fluid of a second cooling circuit 36 can flow through the interior 12 of the housing 14 in cross-flow to the first cooling circuit 30. In the exemplary embodiment illustrated, the power electronics system 16, the link capacitor 20, the driver 22 and the electrical lines 18 can have the fluid of the second cooling circuit 36 flow around them, with the controller 24 being provided for safety in a dry space 38 which is sealed with respect to the fluid of the second cooling circuit 36.

Figure 2:
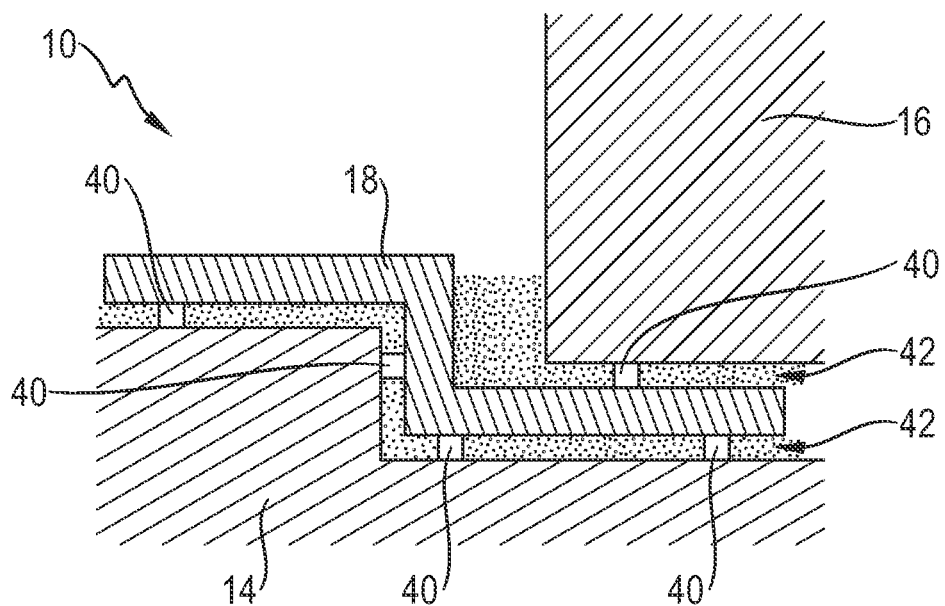
FIG. 2 shows a schematic sectional view of a first detail of the pulse inverter from FIG. 1.

As is illustrated in FIG. 2, the electrical lines configured as busbars can be supported on components of the pulse inverter 10, for example the power electronics system 16 and/or the housing 14, via webs 40. The webs 40 form intermediate spaces 42 through which the fluid of the second cooling circuit 36 can flow along the respective component of the pulse inverter 10 and/or the housing.

Figure 3:
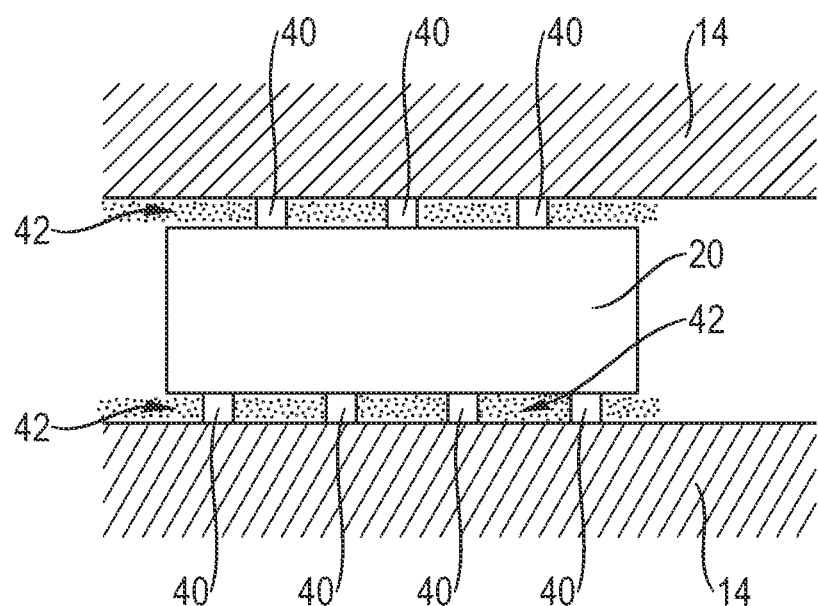
FIG. 3 shows a schematic sectional view of a second detail of the pulse inverter from FIG. 1.

As is illustrated in FIG. 3, for example the link capacitor 20 can be supported spaced apart on both sides of the housing 14 via the webs 40. As a result, the fluid of the second cooling circuit 36 can flow around the link capacitor 20 and/or another component of the pulse inverter 10 on both sides and/or on the underside and/or the top side.

Figure 4:
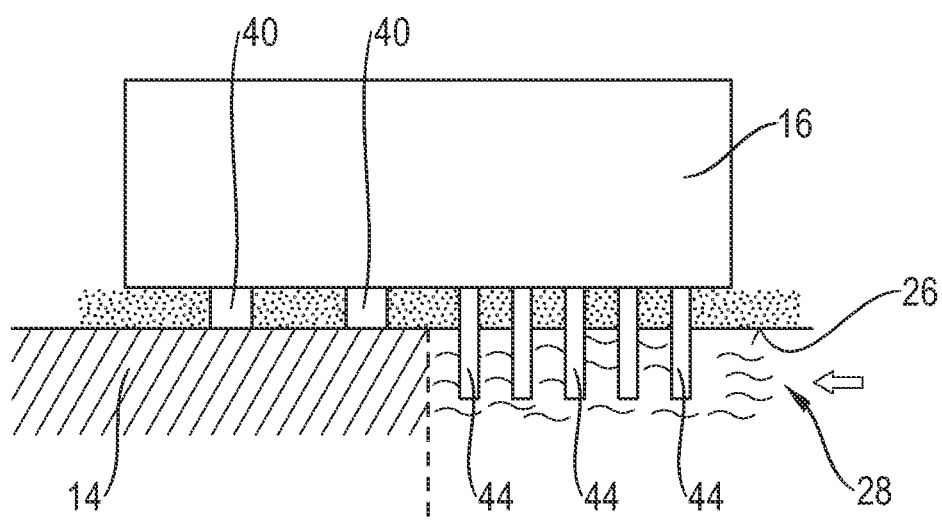
FIG. 4 shows a schematic sectional view of a third detail of the pulse inverter from FIG. 1.

As is illustrated in FIG. 4, for example the power electronics system 16 can have cooling structures 44 configured as cooling ribs, which can project through the housing 14 into the cooling duct 28 of the first cooling circuit 30. In particular, when the power electronics system 16 is spaced apart from the housing 14 via the webs 40, the fluid of the second cooling circuit 36 can also dissipate heat from the cooling structures 44. As an alternative, the power electronics system 16 can bear against the housing 14 directly or via a heat conduction pad.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A pulse inverter for operating an electric machine of a motor vehicle from a motor vehicle battery, the pulse inverter comprising:
   a housing for delimiting an interior;
   a power electronics system, provided in the interior of the housing, and configured to convert direct current to alternating current;
   a first cooling circuit extending between a first inlet in the housing and a first outlet in the housing, the first cooling circuit configured to dissipate heat from an outer side of the housing facing away from the power electronics system; and
   a second cooling circuit extending between a second inlet in the housing and a second outlet in the housing, which wherein the second cooling circuit is separated from the first cooling circuit and in thermal contact with the interior of the housing and heat from the power electronics system, the second cooling circuit configured to directly liquid-cool the power electronics system with an electrically insulating fluid.

2. The pulse inverter as claimed in claim 1, comprising a link capacitor, coupled to the power electronics system, for smoothing voltage ripples and/or current ripples, and/or a driver for switching electronic components of the power electronics system and/or of the link capacitor, and/or a controller configured to control the power electronics system in response to an actuating signal arranged in the interior of the housing, and wherein the link capacitor and/or the driver and/or the controller is configured such that the fluid of the second cooling circuit flows around it.

3. The pulse inverter as claimed in claim 2, wherein the controller is arranged in a dry space separated from the fluid of the second cooling circuit, and wherein electrical lines and/or signal lines connected to the controller are guided through a partition in the dry space into the interior which communicates with the second cooling circuit.

4. The pulse inverter as claimed in claim 3, wherein electronic components and/or electrical lines and/or signal lines arranged in the interior of the housing have electrically conductive elements, and wherein at least a portion of the electrically conductive elements are in direct contact with the fluid and/or at least a portion of the electrically conductive elements are covered by an anticorrosive material.

5. The pulse inverter as claimed in claim 1, wherein the first cooling circuit and the second cooling circuit cool the power electronics system in a cross-flow configuration.

6. The pulse inverter as claimed in claim 1, wherein the first cooling circuit has a flow cross section comprising a width corresponding to an extent of a width of the power electronics system, and wherein an extent of the interior and of the housing is greater than the extent of the power electronics system.

7. The pulse inverter as claimed in claim 1, wherein the second cooling circuit is configured to produce a turbulent flow at least in a region of the power electronics system.

8. The pulse inverter as claimed in claim 1, wherein the power electronics system and/or further components is/are supported via webs on the housing, which project from a printed circuit board, and wherein the second cooling circuit is configured to convey the fluid between the webs.

9. The pulse inverter as claimed in claim 1, wherein the power electronics system has cooling structures which project into a flow cross section of the first cooling circuit.

10. The pulse inverter as claimed in claim 1, wherein the housing is produced from a metallic material.

11. The pulse inverter as claimed in claim 4, wherein the anticorrosive material is a lacquer and/or a potting compound.

12. A pulse inverter for operating an electric machine of a motor vehicle from a motor vehicle battery, the pulse inverter comprising:
   a housing for delimiting an interior;
   a power electronics system, provided in the interior of the housing, for converting direct current to alternating current;
   a first cooling circuit configured to dissipate heat from an outer side of the housing facing away from the power electronics system;
   a second cooling circuit, which is separated from the first cooling circuit, is in fluid communication with the interior of the housing, and is configured to directly liquid-cool the power electronics system with an electrically insulating fluid;
   a link capacitor coupled to the power electronics system for smoothing voltage ripples;
   a driver for switching electronic components of the power electronics system; and
   a controller configured to control the power electronics system in response to an actuating signal arranged in the interior of the housing, wherein the link capacitor, the driver, and the controller are configured such that the fluid of the second cooling circuit flows around the link capacitor, the driver, and the controller.

13. The pulse inverter as claimed in claim 12, wherein the controller is arranged in a dry space separated from the fluid of the second cooling circuit, and wherein electrical lines and/or signal lines connected to the controller are guided through a partition in the dry space into the interior which communicates with the second cooling circuit.

14. The pulse inverter as claimed in claim 13, wherein electronic components and/or electrical lines and/or signal lines arranged in the interior of the housing have electrically conductive elements, and wherein at least a portion of the electrically conductive elements are in direct contact with the fluid and/or at least a portion of the electrically conductive elements are covered by an anticorrosive material.

15. The pulse inverter as claimed in claim 14, wherein the anticorrosive material is a lacquer and/or a potting compound.

* * * * *